US009159926B2

(12) United States Patent
Newsome

(10) Patent No.: US 9,159,926 B2
(45) Date of Patent: Oct. 13, 2015

(54) LOW CONTACT RESISTANCE ORGANIC THIN FILM TRANSISTORS

(75) Inventor: Christopher Newsome, St. Ives (GB)

(73) Assignee: CAMBRIDGE DISPLAY TECHNOLOGY LIMITED, Cambridgeshire (GB)

( * ) Notice: Subject to any disclaimer, the term of this patent is extended or adjusted under 35 U.S.C. 154(b) by 149 days.

(21) Appl. No.: 13/817,527

(22) PCT Filed: Aug. 16, 2011

(86) PCT No.: PCT/GB2011/001222
§ 371 (c)(1),
(2), (4) Date: Feb. 18, 2013

(87) PCT Pub. No.: WO2012/022935
PCT Pub. Date: Feb. 23, 2012

(65) Prior Publication Data
US 2013/0149812 A1 Jun. 13, 2013

(30) Foreign Application Priority Data

Aug. 18, 2010 (GB) .................................. 1013820.4

(51) Int. Cl.
H01L 51/00 (2006.01)
H01L 51/05 (2006.01)

(52) U.S. Cl.
CPC ........ *H01L 51/0034* (2013.01); *H01L 51/0003* (2013.01); *H01L 51/0007* (2013.01); *H01L 51/0074* (2013.01); *H01L 51/004* (2013.01); *H01L 51/0035* (2013.01); *H01L 51/0043* (2013.01); *H01L 51/0541* (2013.01); *H01L 51/0545* (2013.01)

(58) Field of Classification Search
CPC ............ H01L 51/0034; H01L 51/0074; H01L 51/0007; H01L 51/0003; H01L 51/0035; H01L 51/0043; H01L 51/0545; H01L 51/004; H01L 51/0541; H01L 51/00
USPC ............................................. 252/500; 438/99
See application file for complete search history.

(56) References Cited

U.S. PATENT DOCUMENTS

| 6,878,312 | B1 * | 4/2005 | Kanbe et al. ................... 252/583 |
| 7,029,945 | B2 * | 4/2006 | Veres et al. ...................... 438/99 |
| 7,968,872 | B2 * | 6/2011 | Schaefer et al. ................. 257/40 |
| 2004/0038459 | A1 | 2/2004 | Brown et al. ................... 438/142 |
| 2008/0038867 | A1 | 2/2008 | Shin et al. |
| 2008/0191199 | A1 * | 8/2008 | Anemian et al. ................ 257/40 |
| 2008/0197325 | A1 * | 8/2008 | Leeming et al. ............. 252/500 |
| 2009/0302311 | A1 * | 12/2009 | Turbiez et al. ................. 257/40 |
| 2009/0314997 | A1 * | 12/2009 | Heeney et al. ................ 252/500 |
| 2010/0090199 | A1 * | 4/2010 | Obuchi et al. .................... 257/40 |
| 2011/0272686 | A1 | 11/2011 | Ohuchi et al. |
| 2012/0190868 | A1 | 7/2012 | Miyata et al. |

FOREIGN PATENT DOCUMENTS

| EP | 2 020 693 A2 | 2/2009 |
| EP | 2 077 590 A1 | 7/2009 |
| GB | 2 441 701 A | 3/2008 |
| GB | 2 465 626 A | 6/2010 |
| WO | WO-2005/055248 A2 | 6/2005 |
| WO | WO-2010/049321 A1 | 5/2010 |
| WO | WO-2010/061176 A1 | 6/2010 |
| WO | WO-2010/084977 A1 | 7/2010 |
| WO | WO-2011/004869 A1 | 1/2011 |

OTHER PUBLICATIONS

Chung et al., "Polymer Binder Effects on the Electrical Characteristics of 6, 13-bis (triisopropylsilylethynyl)-Pentacene Thin-Film Transistors in Different Solvents," *Thin Solid Films*, 518:6289-6294 (2010).
Kang et al., "Structure and Properties of Small Molecule-Polymer Blend Semiconductors for Organic Thin Film Transistors," *J. Am. Chem. Soc.*, 130(37):12273-12275 (2008).
Madec et al., "Organic Semiconductor-Polymer Insulator Blends: A Morphological Study of the Guest-Host Interactions," *J. Surf. Sci. Nanotech.*, 7:455-458 (2009).
Ohe et al., "Solution-Processed Organic Thin-Film Transistors with Vertical Nanophase Separation," *Appl. Phys. Lett.*, 93(5):053303-1-053303-3 (2008).
Russell et al., "Blends of Semiconductor Polymer and Small Molecular Crystals for Improved-Performance Thin-Film Transistors," *Appl. Phys. Lett.*, 87(22):222109-1-222109-3 (2005).
Smith et al., "High-Performance Organic Integrated Circuits Based on Solution Processable Polymer-Small Molecule Blends," *Appl. Phys. Lett.*, 93(25):253301-1-253301-3 (2008).
International Preliminary Report on Patentability for Application No. PCT/GB2011/001222, dated Feb. 19, 2013.
International Search Report and Written Opinion for Application No. PCT/GB2011/001222, dated Nov. 22, 2011.
Search Report for Application No. GB1013820.4, dated Jan. 7, 2011.

* cited by examiner

Primary Examiner — Douglas McGinty
(74) Attorney, Agent, or Firm — Marshall, Gerstein & Borun LLP

(57) ABSTRACT

The invention provides the use of a solvent selected from the group consisting of alkoxybenzenes and alkyl substituted alkoxybenzenes in reducing the contact resistance in an organic thin film transistor comprising a semiconductor layer comprising a blend of a small molecule semiconductor material and a polymer material that is deposited from a solution of said small molecule semiconductor material and said polymer material in said solvent and novel semiconductor blend formulations that are of particular use in preparing organic thin film transistors. Said solvents yield devices with lower absolute contact resistance, lower absolute channel resistance, and lower proportion of contact resistance to the total channel resistance.

29 Claims, 3 Drawing Sheets

LOW CONTACT RESISTANCE ORGANIC THIN FILM TRANSISTORS

The present invention relates to organic thin film transistors, and in particular to the reduction of contact resistance in said transistors, especially those with a short channel length.

BACKGROUND OF THE INVENTION

Transistors can be divided into two main types: bipolar junction transistors and field-effect transistors. Both types share a common structure comprising three electrodes with a semiconductive material disposed therebetween in a channel region. The three electrodes of a bipolar junction transistor are known as the emitter, collector and base, whereas in a field-effect transistor the three electrodes are known as the source, drain and gate. Bipolar junction transistors may be described as current-operated devices as the current between the emitter and collector is controlled by the current flowing between the base and emitter. In contrast, field-effect transistors may be described as voltage-operated devices as the current flowing between source and drain is controlled by the voltage between the gate and the source.

Transistors can also be classified as p-type and n-type according to whether they comprise semiconductive material which conducts positive charge carriers (holes) or negative charge carriers (electrons) respectively. The semiconductive material may be selected according to its ability to accept, conduct, and donate charge. The ability of the semiconductive material to accept, conduct, and donate holes or electrons can be enhanced by doping the material. The material used for the source and drain electrodes can also be selected according to its ability to accept and inject holes or electrons. For example, a p-type transistor device can be formed by selecting a semiconductive material which is efficient at accepting, conducting, and donating holes, and selecting a material for the source and drain electrodes which is efficient at injecting and accepting holes from the semiconductive material. Good energy-level matching of the Fermi-level in the electrodes with the HOMO (Highest Occupied Molecular Orbital) level of the semiconductive material can enhance hole injection and acceptance. In contrast, an n-type transistor device can be formed by selecting a semiconductive material which is efficient at accepting, conducting, and donating electrons, and selecting a material for the source and drain electrodes which is efficient at injecting electrons into, and accepting electrons from, the semiconductive material. Good energy-level matching of the Fermi-level in the electrodes with the LUMO (Lowest Unoccupied Molecular Orbital) level of the semiconductive material can enhance electron injection and acceptance.

Transistors can be formed by depositing the components in thin films to form thin film transistors. When an organic material is used as the semiconductive material in such a device, it is known as an organic thin film transistor.

Various arrangements for organic thin film transistors are known. One such device is an insulated gate field-effect transistor which comprises source and drain electrodes with a semiconductive material disposed therebetween in a channel region, a gate electrode disposed over the semiconductive material and a layer of insulting material disposed between the gate electrode and the semiconductive material in the channel region.

An example of such an organic thin film transistor is shown in FIG. 1. The illustrated structure may be deposited on a substrate (not shown) and comprises source and drain electrodes 2, 4 which are spaced apart with a channel region 6 located therebetween. An organic semiconductor 8 is deposited in the channel region 6 and may extend over at least a portion of the source and drain electrodes 2, 4. An insulating layer 10 of dielectric material is deposited over the organic semi-conductor 8 and may extend over at least a portion of the source and drain electrodes 2, 4. Finally, a gate electrode 12 is deposited over the insulating layer 10. The gate electrode 12 is located over the channel region 6 and may extend over at least a portion of the source and drain electrodes 2, 4.

The structure described above is known as a top-gate organic thin film transistor as the gate is located on a top side of the device. Alternatively, it is also known to provide the gate on a bottom side of the device to form a so-called bottom-gate organic thin film transistor.

An example of such a bottom-gate organic thin film transistor is shown in FIG. 2. In order to show more clearly the relationship between the structures illustrated in FIGS. 1 and 2, like reference numerals have been used for corresponding parts. The bottom-gate structure illustrated in FIG. 2 comprises a gate electrode 12 deposited on a substrate 1 with an insulating layer 10 of dielectric material deposited thereover. Source and drain electrodes 2, 4 are deposited over the insulating layer 10 of dielectric material. The source and drain electrodes 2, 4 are spaced apart with a channel region 6 located therebetween over the gate electrode. An organic semiconductor 8 is deposited in the channel region 6 and may extend over at least a portion of the source and drain electrodes 2, 4.

The conductivity of the channel can be altered by the application of a voltage at the gate. In this way the transistor can be switched on and off using an applied gate voltage. The drain current that is achievable for a given voltage is dependent on the mobility of the charge carriers in the organic semiconductor in the active region of the device (the channel region between the source and drain electrodes). Thus, in order to achieve high drain currents with low operational voltages, organic thin film transistors must have an organic semiconductor which has highly mobile charge carriers in the channel region.

There are various compound types that have been developed in recent years that are potentially suitable for use as the semiconductive material in organic thin film transistors. One such class of particular importance is the so-called small molecule semiconductors. These are non-polymeric semi-conducting organic molecules. Typical examples include pentacene derivatives and thiophene derivatives.

Although small molecule semiconductor materials can exhibit high mobilities due to their highly crystalline texture (particularly as thermally evaporated thin films) it can often be difficult to obtain repeatable results from solution processed films due to their poor film forming properties. Issues with material reticulation from and adhesion to substrates, film roughness and film thickness variations can limit the performance of these materials in devices. Film roughness can be a further problem for top-gate organic thin film transistor devices, as the accumulation layer is formed at the uppermost surface of the semiconductor layer.

To overcome this problem, the use of semiconductor blends consisting of small molecules and polymers has been developed. The motivation for using such blends is primarily to overcome the poor film forming properties of the small molecule semiconductor materials. Blends of small molecules with polymers exhibit superior film forming properties to the small molecule component due to the excellent film forming properties of polymer materials.

A few examples of such blends (semiconductor-semiconductor or semiconductor—insulator) in the literature include Smith et. al., Applied Physics Letters, Vol 93, 253301 (2008); Russell et. al., Applied Physics Letters, Vol 87, 222109 (2005); Ohe et. al., Applied Physics Letters, Vol 93, 053303 (2008); Madec et. al., Journal of Surface Science & Nanotechnology, Vol 7, 455-458 (2009); and Kang et. al., J. Am. Chem. Soc., Vol 130, 12273-75 (2008). Another example is WO 2005/055248, which discloses the preparation of organic thin film transistors in which the semiconductor layer is a blend of a pentacene derivative with a semiconductor binder such as a poly(triarylamine) or poly(9-vinylcarbazole) deposited from a solution thereof in a solvent. The solvent used in one of the examples is anisole. However, there is no disclosure or suggestion in WO 2005/055248 that its use would reduce contact resistance.

Chung et al, Thin Solids Films, published online Mar. 6, 2010, discloses the preparation of organic thin film transistors in which the semiconductor layer is a blend of TIPS-pentacene with a poly(triarylamine) deposited from a solution thereof in a solvent. The solvent used in one of the examples is anisole. The authors discuss some properties resulting from the use of different solvents to deposit the blend, such as enhanced morphology and charge mobility in the channel region. However, there is no correlation between the disclosed properties and contact resistance.

The prior art relating to semiconductor small molecule-polymer blends has focused on improving the charge mobility and on good stability. Selection of the semiconductor material(s) and their ratios in the blend in order to optimise the field effect mobility has been the major area of concern. No research has been conducted into the solvent selection to reduce contact resistance in devices incorporating semiconductor blends.

The contact resistance in organic thin film transistors is a crucial parameter to minimise (ideally eliminate), particularly for short channel length devices (<20 μm), where this resistance can contribute a significant proportion to the total channel resistance in the device. The higher the contact resistance in the device, the higher the proportion of the applied voltage is dropped across this and, as a result, the lower the bias across the channel region is achieved. A high contact resistance has the effect of a much lower current level being extracted from the device due to the lower bias applied across the channel region, and hence lower device mobility.

Minimising the contact resistance is particularly important in devices incorporating high mobility semiconductor materials, as the channel resistance is lower (high conductivity) than that observed in for example amorphous phase polymer semiconductors alone at the same channel length. This is therefore of particular importance for semiconductor materials comprising crystalline materials that exhibit high mobilities. For small molecule materials such as benzothiophene derivatives and pentacene derivatives a low solubility is found (0.4% w/v limit) and a poor film quality is also found. Above this concentration, the material will form a crystalline precipitate in the host solvent. In this case adding a polymer semiconductor becomes important from the point of view of increasing the solution viscosity to improve film formation and to act as a binder to ensure a continuous film is obtained spanning from the source to drain electrodes. The polymer semiconductor exhibits a high solubility in the same solvents (above 2% w/v).

Conventionally, the contact resistance in organic thin film transistors is reduced solely by applying surface treatment layers to the source and drain electrodes prior to depositing the semiconductor film or by changing the metal to a higher work function metal as necessary to inject charges to the HOMO level (for a p-type material). Such treatment layers (typically self assembled monolayers applied from solution or vapour phase) are used to produce a dipole layer at the metal surface to effectively shift the work function of the source and drain contacts to align with the HOMO level in the semiconductor and therefore reduce the barrier for charge injection from metal to the semiconductor.

In some instances, these methods alone are not sufficient to minimise the contact resistance. There is a need to find additional ways of reducing the contact resistance of organic thin film transistors comprising semiconductor blend layers.

SUMMARY OF THE INVENTION

We have surprisingly discovered that the solvent for the semiconductor layer is critical in order to reduce the contact resistance of organic thin film transistors. Certain solvents can be used to deposit a semiconductor layer comprising a blend of a small molecule semiconductor material and a polymer material from a solution thereof in said solvents, the resulting organic thin film transistor comprising the semiconductor blend layer surprisingly being found to have a much lower contact resistance than that achieved with other solvents.

(1) Thus, in a first aspect of the present invention there is provided use of a solvent selected from the group consisting of $C_{1-4}$ alkoxybenzenes and $C_{1-4}$ alkyl substituted $C_{1-4}$ alkoxybenzenes in reducing the contact resistance in an organic thin film transistor comprising a semiconductor layer, wherein said semiconductor layer comprises a blend of a small molecule semiconductor material and a polymer material that is deposited from a solution of said small molecule semiconductor material and said polymer material in said solvent.

Thus, we have made the surprising discovery that using a solvent selected from the group consisting of $C_{1-4}$ alkoxybenzenes and $C_{1-4}$ alkyl substituted $C_{1-4}$ alkoxybenzenes to prepare the semiconductor blend formulation for depositing as a semiconductor layer comprising a blend of a small molecule material and a polymer material and then depositing said blend of small molecule semiconductor material and polymer material in the formation of said transistor (e.g. in the channel of a partially formed top gate organic thin film transistor) reduces the contact resistance resulting from interaction between said semiconductor blend and the electrodes. This is of particular importance as the contact resistance is a crucial parameter to minimise, particularly for short channel length devices, where this resistance can contribute a significant proportion to the total channel resistance in the device.

Preferred uses according to the present invention include:

(2) use according to (1) wherein the contact resistance is reduced compared to an organic thin film transistor employing an equivalent amount of xylene in place of a solvent selected from said group;

(3) use according to (2), wherein the contact resistance using said solvent in depositing said semiconductor layer of said organic thin film transistor is less than 50% the value obtained employing an equivalent amount of xylene;

(4) use according to (2), wherein the contact resistance using said solvent in depositing said semiconductor layer of said organic thin film transistor or in semiconductor layer formulation is less than 30% the value obtained employing an equivalent amount of xylene;

(5) use according to (2), wherein the contact resistance using said solvent in depositing said semiconductor layer of said organic thin film transistor or in semiconductor layer formulation is less than 15% the value obtained employing an equivalent amount of xylene;

(6) use according to any one of (1) to (5), wherein said solvent is selected from the group consisting of anisole, 2-methylanisole and 4-methylanisole;

(7) use according to any one of (1) to (6), wherein the polymer material is a semiconducting polymer material;

(8) use according to (7), wherein said semiconducting polymer material is a conjugated polymer comprising a repeat unit of formula (I)

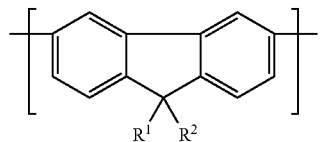

(I)

wherein R¹ and R² are the same or different and each is selected from the group consisting of hydrogen, an alkyl group having from 1 to 16 carbon atoms, an aryl group having from 5 to 14 carbon atoms and a 5- to 7-membered heteroaryl group containing from 1 to 3 sulfur atoms, oxygen atoms and/or nitrogen atoms, said aryl group or heteroaryl group being unsubstituted or substituted with one or more substituents selected from an alkyl group having from 1 to 16 carbon atoms and an alkoxy group having from 1 to 16 carbon atoms;

(9) use according to (8), wherein said semiconducting polymer material is a conjugated polymer comprising the repeat unit (I), wherein R¹ and R² are the same or different and each is selected from the group consisting of hydrogen, an alkyl group having from 1 to 12 carbon atoms and a phenyl group, said phenyl group being unsubstituted or substituted with one or more substituents selected from an alkyl group having from 1 to 12 carbon atoms and an alkoxy group having from 1 to 12 carbon atoms;

(10) use according to (8), wherein said semiconducting polymer material is a conjugated polymer comprising the repeat unit (I), wherein R¹ and R² are the same or different and each is selected from the group consisting of an alkyl group having from 4 to 12 carbon atoms and a phenyl group, said phenyl group being unsubstituted or substituted with one or more substituents selected from an alkyl group having from 4 to 8 carbon atoms and an alkoxy group having from 4 to 8 carbon atoms;

(11) use according to any one of (8) to (10), wherein said semiconducting polymer material is a conjugated polymer comprising the repeat unit (I), said polymer further comprising a repeat unit of formula (II):

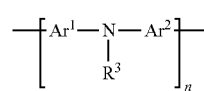

(II)

wherein Ar¹ and Ar² are the same or different and each is selected from an aryl group having from 5 to 14 carbon atoms and a 5- to 7-membered heteroaryl group containing from 1 to 3 sulfur atoms, oxygen atoms and/or nitrogen atoms, said aryl group or heteroaryl group being unsubstituted or substituted with one or more substituents selected from an alkyl group having from 1 to 16 carbon atoms and an alkoxy group having from 1 to 16 carbon atoms; R3 is an alkyl group having from 1 to 8 carbon atoms or a phenyl group which may be unsubstituted or substituted with an alkyl group having from 1 to 8 carbon atoms;

and n is an integer greater than or equal to 1, preferably 1 or 2;

(12) use according to (11), wherein each of Ar¹ and Ar² is a phenyl group and R3 is an alkyl group having from 1 to 8 carbon atoms or a phenyl group which may optionally be substituted with an alkyl group having from 1 to 8 carbon atoms;

(13) use according to (11), wherein said semiconducting polymer material is TFB [9,9'-dioctylfluorene-co-N-(4-butylphenyl)-diphenylamine]n;

(14) use according to any one of (1) to (13), wherein said small molecule semiconductor material is selected from the group consisting of substituted pentacenes and organic semiconducting compounds of formula (III):

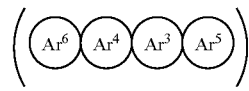

(III)

wherein Ar³, Ar⁴, Ar⁵ and Ar⁶ independently comprise monocyclic aromatic rings and at least one of Ar³, Ar⁴, Ar⁵ and Ar⁶ is substituted with at least one substituent X, which in each occurrence may be the same or different and is selected from the group consisting of (i) unsubstituted or substituted straight, branched or cyclic alkyl groups having from 1 to 20 carbon atoms, alkoxy groups having from 1 to 12 carbon atoms, amino groups that may be unsubstituted or substituted with one or two alkyl groups having from 1 to 8 carbon atoms, each of which may be the same or different, amido groups, silyl groups and alkenyl groups having from 2 to 12 carbon atoms, or (ii) a polymerisable or reactive group selected from the group consisting of halogens, boronic acids, diboronic acids and esters of boronic acids and diboronic acids, alkylene groups having from 2 to 12 carbon atoms and stannyl groups, and wherein Ar³, Ar⁴, Ar⁵ and Ar⁶ may each optionally be fused to one or more further monocyclic aromatic rings, and wherein at least one of Ar³, Ar⁴, Ar⁵ and Ar⁶ comprises a 5- to 7-membered heteroaryl group containing from 1 to 3 sulfur atoms, oxygen atoms, selenium atoms and/or nitrogen atoms;

(15) use according to (14), wherein Ar⁵ is fused to a further aryl group Ar⁷ to provide a structure of formula (IV):

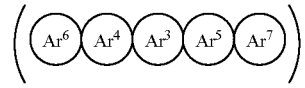

(IV)

wherein Ar⁷ represents a monocyclic aromatic ring unsubstituted or substituted with one or more substituents X, said monocyclic aromatic ring Ar⁷ preferably being a 5- to 7-membered heteroaryl group containing from 1 to 3 sulfur atoms, oxygen atoms, selenium atoms and/or nitrogen atoms;

(16) use according to (15), wherein Ar⁶ is fused to a further aryl system Ar⁸ to provide a structure of formula (V):

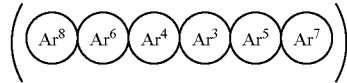

(V)

wherein Ar⁸ represents a monocyclic aromatic ring unsubstituted or substituted with one or more substituents X, said monocyclic aromatic ring Ar⁸ preferably being a 5- to 7-membered heteroaryl group containing from 1 to 3 sulfur atoms, oxygen atoms, selenium atoms and/or nitrogen atoms;

(17) use according to (16), wherein Ar⁷ is fused to a further aryl system Ar⁹ to provide a structure of formula (VI):

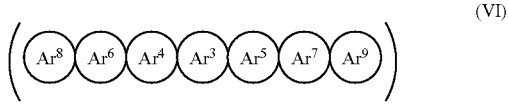

wherein Ar⁹ represents a monocyclic aromatic ring unsubstituted or substituted with one or more substituents X, said monocyclic aromatic ring Ar⁹ preferably being a 5- to 7-membered heteroaryl group containing from 1 to 3 sulfur atoms, oxygen atoms, selenium atoms and/or nitrogen atoms;

(18) use according to any one of (14) to (17), wherein the organic semiconducting compound comprises the structure:

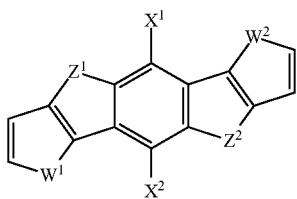

wherein $X^1$ and $X^2$ may be the same or different and are selected from substituents X as defined in (15); $Z^1$ and $Z^2$ are independently S, O, Se or $NR^4$; and $W^1$ and $W^2$ are independently S, O, Se, $NR^4$ or —$CR^4$=$CR^4$—, where $R^4$ is H or a substituent selected from the group consisting of unsubstituted or substituted straight, branched or cyclic alkyl groups having from 1 to 20 carbon atoms, alkoxy groups having from 1 to 12 carbon atoms, amino groups that may be unsubstituted or substituted with one or two alkyl groups having from 1 to 8 carbon atoms, each of which may be the same or different, amido groups, silyl groups and alkenyl groups having from 2 to 12 carbon atoms;

(19) use according to any one of (14) to (17), wherein the organic semiconducting compound comprises the structure:

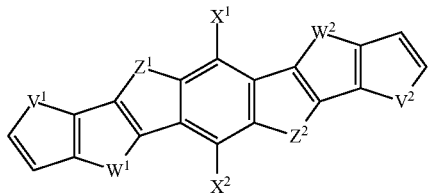

wherein $X^1$ and $X^2$ are as defined in (14), $Z^1$, $Z^2$, $W^1$ and $W^2$ are as defined in (18) and V1 and V2 are independently S, O, Se or $NR^5$ wherein $R^5$ is H or a substituent selected from the group consisting of unsubstituted or substituted straight, branched or cyclic alkyl groups having from 1 to 20 carbon atoms, alkoxy groups having from 1 to 12 carbon atoms, amino groups that may optionally be substituted with one or two alkyl groups having from 1 to 8 carbon atoms, each of which may be the same or different, amido groups, silyl groups and alkenyl groups having from 2 to 12 carbon atoms;

(20) use according to any one of (14) to (17), wherein the semiconducting compound comprises the structure:

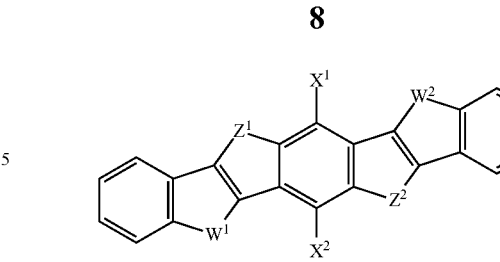

wherein $X^1$ and $X^2$ are as defined in (14) and $Z^1$, $Z^2$, $W^1$ and $W^2$ are as defined in (18).

(21) use according to any one of (14) to (17), wherein the semiconducting compound comprises the structure:

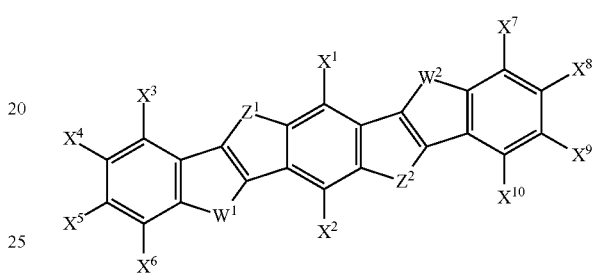

wherein $Z^1$, $Z^2$, $W^1$ and $W^2$ are as defined in (18) and $X^1$—$X^{10}$, which may be the same or different, are selected from substituents X as defined in (14).

(22) use according to (14), wherein said small molecule semiconductor material is a benzothiophene derivative of formula (VII):

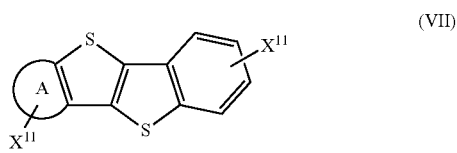

wherein A is a phenyl group or a thiophene group, said phenyl group or thiophene group optionally being fused with a phenyl group or a thiophene group which can be unsubstituted or substituted with at least one group of formula $X^{11}$ and/or fused with a group selected from a phenyl group, a thiophene group and a benzothiophene group, any of said phenyl, thiophene and benzothiphene groups being unsubstituted or substituted with at least one group of formula $X^{11}$; and each group $X^{11}$ may be the same or different and is selected from substituents X as defined in (14), and preferably is a group of formula $C_nH_{2n+1}$ wherein n is 0 or an integer of from 1 to 20;

(23) use according to (22), wherein said small molecule semiconductor material is a benzothiophene derivative of formula (VII) wherein A is selected from:

a thiophene group that is fused with a phenyl group substituted with at least one group of formula $X^{11}$; or a phenyl group that may optionally be substituted with at least one group of formula $X^11$, said phenyl group further optionally being fused with a thiophene group which can be unsubstituted or substituted with at least one group of formula $X^{11}$ and/or fused with a benzothiophene group, said benzothiphene group being unsubstituted or substituted with at least one group of formula $X^{11}$, wherein $X^{11}$ is a group of formula $C_nH_{2n+1}$ wherein n is 0 or an integer of from 1 to 16;

(24) use according to (22), wherein said small molecule semiconductor material is a benzothiophene derivative of formula (VII) selected from the following group:

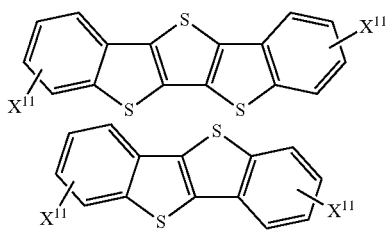

wherein $X^{11}$ is a group of formula $C_nH_{2n+1}$ wherein n is an integer of from 4 to 16;

(25) use according to any one of (1) to (24), wherein the ratio by weight of said small molecule semiconductor material to said polymer material is from 10:90 to 90:10;

(26) use according to (25), wherein the ratio by weight is from 30:70 to 80:20;

(27) use according to (25), wherein the ratio by weight is from 80:20 to 60:40, preferably 70:30;

(28) use according to (1) of a solvent selected from the group consisting of anisole, 2-methylanisole and 4-methylanisole in reducing the contact resistance in an organic thin film transistor comprising a semiconductor layer, wherein said semiconductor layer comprises a blend of a small molecule semiconductor material and a polymer material comprising a semiconducting conjugated polymer, wherein:

the ratio by weight of said small molecule semiconductor material to said polymer material is from 80:20 to 60:40;

said semiconducting conjugated polymer comprises the repeat unit (I) according to (8), wherein $R^1$ and $R^2$ are the same or different and each is selected from the group consisting of an alkyl group having from 4 to 12 carbon atoms and a phenyl group, said phenyl group being unsubstituted or substituted with one or more substituents selected from an alkyl group having from 4 to 8 carbon atoms and an alkoxy group having from 4 to 8 carbon atoms, said semiconducting conjugated polymer further comprising the repeat unit of formula (II) as defined in (11) wherein each of $Ar^1$ and $Ar^2$ is a phenyl group and R3 is an alkyl group having from 1 to 8 carbon atoms or a phenyl group which may be unsubstituted or substituted with an alkyl group having from 1 to 8 carbon atoms; and said small molecule semiconductor material has the following formula:

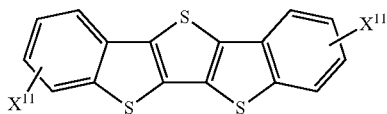

wherein $X^{11}$ is a group of formula $C_nH_{2n+1}$ wherein n is an integer of from 4 to 16;

(29) use according to (28), wherein:

said solvent is selected from the group consisting of anisole, 2-methylanisole and 4-methylanisole;

the ratio by weight of said small molecule semiconductor material to said polymer material is 70:30;

each group $X^{11}$ in said small molecule semiconductor material is a hexyl group; and said polymer material is TFB [9,9'-dioctylfluorene-co-N-(4-butylphenyl)-diphenylamine]n;

(30) use according to any one of (1) to (29) in reducing the contact resistance in an organic thin film transistor, said organic thin film transistor comprising source and drain electrodes with a channel region therebetween having a channel length, a gate electrode, a dielectric layer disposed between the source and drain electrodes and the gate electrode and the semiconductor layer according to any one of (1) to (29) disposed in at least the channel region between the source and drain electrodes;

(31) use according to (30), wherein the channel length is less than or equal to 20 μm;

(32) use according to (30), wherein the channel length is less than or equal to 10 μm; and

(33) use according to any one of (30) to (32), wherein the proportion of the contact resistance to the total channel resistance in said organic thin film transistor is less than 60%, preferably less than 50%.

We have also discovered certain novel semiconductor blend formulations that are particularly suitable for use in the preparation of organic thin film transistors, as they have both excellent device mobilities and give very low contact resistance when the blend has been deposited from the solvents of the invention. Thus, in a second aspect of the present invention there is provided:

(34) a semiconductor blend formulation comprising a small molecule semiconductor material, a polymer material and a solvent, wherein:

said polymer material is a semiconducting conjugated polymer as defined in any one of (8) to (13) above;

said small molecule semiconductor material is a semiconductor as defined in any one of (14) to (24) above;

said solvent is selected from the group consisting of $C_{1-4}$ alkoxybenzenes and $C_{1-4}$ alkyl substituted $C_{1-4}$ alkoxybenzenes; and the ratio of said small molecule semiconductor material to said polymer material in said blend is from 10:90 to 90:10;

Preferred embodiments of the semiconductor blend formulation of the invention include:

(35) a semiconductor blend formulation according to (34), wherein:

said semiconducting conjugated polymer comprises the repeat unit (I) as defined in (8) above, wherein $R^1$ and $R^2$ are the same or different and each is selected from the group consisting of an alkyl group having from 4 to 12 carbon atoms and a phenyl group, said phenyl group being unsubstituted or substituted with one or more substituents selected from an alkyl group having from 4 to 8 carbon atoms and an alkoxy group having from 4 to 8 carbon atoms, said conjugated polymer further comprising the repeat unit of formula (II) as defined in (11) above wherein each of $Ar^1$ and $Ar^2$ is a phenyl group and R3 is an alkyl group having from 1 to 8 carbon atoms or a phenyl group which may be unsubstituted or substituted with an alkyl group having from 1 to 8 carbon atoms;

said small molecule semiconductor material is a benzothiophene derivative of formula (VII):

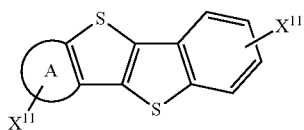

(VII)

wherein A is a phenyl group or a thiophene group, said phenyl group or thiophene group optionally being fused with a phenyl group or a thiophene group which can be unsubstituted or substituted with at least one group of formula $X^1 1$ and/or fused with a group selected from a phenyl group, a thiophene group and a benzothiophene group, any of said phenyl, thiophene and benzothiophene groups being unsubstituted or substituted with at least one group of formula $X^{11}$; and each group $X^{11}$ may be the same or different and is selected from substituents X as defined in (14) above, and preferably is a group of formula $C_nH_{2n+1}$ wherein n is 0 or an integer of from 1 to 20;

said solvent is selected from the group consisting of anisole, 2-methylanisole and 4-methylanisole; and the ratio of said small molecule semiconductor material to said polymer material in said blend is from 30:70 to 80:20;

(36) a semiconductor blend formulation according to (35), wherein:

said semiconducting conjugated polymer is TFB [9,9'-dioctylfluorene-co-N-(4-butylphenyl)-diphenylamine]$_n$;

and said small molecule semiconductor material is a compound of formula (VII) as defined in (35) wherein A is selected from:

a thiophene group that is fused with a phenyl group substituted with at least one group of formula $X^{11}$;

a phenyl group that may be unsubstituted or substituted with at least one group of formula $X^{11}$, said phenyl group further optionally being fused with a thiophene group which can be unsubstituted or substituted with at least one group of formula $X^{11}$ and/or fused with a benzothiophene group, said benzothiophene group being unsubstituted or substituted with at least one group of formula $X^{11}$, wherein $X^{11}$ is a group of formula $C_nH_{2n+1}$ wherein n is 0 or an integer of from 1 to 16; and the ratio of said small molecule semiconductor material to said polymer material in said blend is from 80:20 to 60:40;

(37) a semiconductor blend formulation according to (36), wherein said small molecule semiconductor material is selected from the following group:

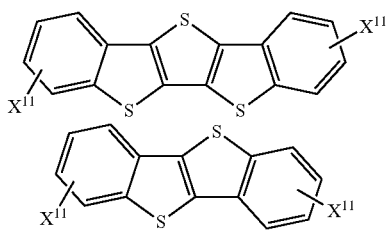

wherein $X^{11}$ is a group of formula $C_nH_{2n+1}$ wherein n is an integer of from 4 to 16; and the ratio of said small molecule semiconductor material to said polymer material in said blend is from 80:20 to 60:40;

(38) a semiconductor blend formulation according to (36) wherein:

said polymer material is TFB [9,9'-dioctylfluorene-co-N-(4-butylphenyl)-diphenylamine]$_n$, and said small molecule semiconductor material has the following formula:

wherein $X^1 1$ is a group of formula $C_nH_{2n+1}$ wherein n is an integer of from 4 to 16; and the ratio of said small molecule semiconductor material to said polymer material in said blend is from 80:20 to 60:40; and

(39) a semiconductor blend formulation according to (38), wherein each group $X^{11}$ is a hexyl group and the ratio of said small molecule semiconductor material to said polymer material is 70:30.

We have also discovered a method for reducing the contact resistance in an organic thin film transistor comprising a channel region and a semiconductor layer by the use of particular solvents. Thus, in a third aspect of the present invention there is provided:

(40) A method for reducing the contact resistance in an organic thin film transistor comprising a channel region and a semiconductor layer, wherein said semiconductor layer comprises a blend of a small molecule semiconductor material and a polymer material, said method comprising depositing said small molecule semiconductor material and said polymer material from a solution thereof in said channel region of said organic thin film transistor, wherein said solution comprises a solvent selected from the group consisting of $C_{1-4}$ alkoxybenzenes and $C_{1-4}$ alkyl substituted $C_{1-4}$ alkoxybenzenes.

We have also discovered a method for reducing the contact resistance in an organic thin film transistor comprising a channel region and a semiconductor layer by the selection of particular solvents. Thus, in a fourth aspect of the present invention there is provided:

(41) A method for reducing the contact resistance in an organic thin film transistor comprising a channel region and a semiconductor layer, wherein said semiconductor layer comprises a blend of a small molecule semiconductor material and a polymer material, said method comprising the steps of:

(i) selecting a solvent from the group consisting of $C_{1-4}$ alkoxybenzenes and $C_{1-4}$ alkyl substituted $C_{1-4}$ alkoxybenzenes and;

(ii) forming a solution of said small molecule semiconductor material and said polymer material in said solvent selected in step (i); and (iii) depositing a semiconductor layer comprising a blend of said small molecule semiconductor material and said polymer material from the solution prepared in step (ii) in the channel region of said organic thin film transistor.

(42) A method according to (41), wherein step (ii) comprises forming a first solution of said small molecule semiconductor material in said solvent, forming a further solution of said polymer material in the same said solvent and then mixing the first and further solutions.

Preferred embodiments of the methods of the third and fourth aspects of the invention include:

(43) a method according to any one of (40) to (42) wherein the contact resistance is reduced compared to an organic thin film transistor employing an equivalent amount of xylene in place of a solvent selected from said group;

(44) a method according to (43), wherein the contact resistance using said solvent in depositing said semiconductor layer of said organic thin film transistor is less than 30% the value obtained employing an equivalent amount of xylene, preferably less than 15%;

(45) a method according to any one of (40) to (44), wherein said solvent is selected from the group consisting of anisole, 2-methylanisole and 4-methylanisole;

(46) a method according to any one of (40) to (45), wherein the polymer material is a semiconducting polymer material;

(47) a method according to (46), wherein said semiconducting polymer material is a conjugated polymer comprising a repeat unit of formula (I)

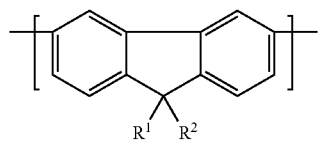

(I)

wherein $R^1$ and $R^2$ are the same or different and each is selected from the group consisting of hydrogen, an alkyl group having from 1 to 16 carbon atoms, an aryl group having from 5 to 14 carbon atoms and a 5- to 7-membered heteroaryl group containing from 1 to 3 sulfur atoms, oxygen atoms and/or nitrogen atoms, said aryl group or heteroaryl group being unsubstituted or substituted with one or more substituents selected from an alkyl group having from 1 to 16 carbon atoms and an alkoxy group having from 1 to 16 carbon atoms;

(48) a method according to (47), wherein said semiconducting polymer material is a conjugated polymer comprising the repeat unit (I), wherein $R^1$ and $R^2$ are the same or different and each is selected from an alkyl group having from 4 to 12 carbon atoms and a phenyl group, said phenyl group being unsubstituted or substituted with one or more substituents selected from an alkyl group having from 4 to 8 carbon atoms and an alkoxy group having from 4 to 8 carbon atoms;

(49) a method according to (47) or (48), wherein said semiconducting polymer material is a conjugated polymer comprising the repeat unit (I), said polymer further comprising a repeat unit of formula (II):

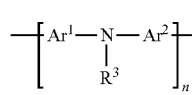

(II)

wherein $Ar^1$ and $Ar^2$ are the same or different and each is selected from the group consisting of an aryl group having from 5 to 14 carbon atoms and a 5- to 7-membered heteroaryl group containing from 1 to 3 sulfur atoms, oxygen atoms and/or nitrogen atoms, said aryl group or heteroaryl group being unsubstituted or substituted with one or more substituents selected from an alkyl group having from 1 to 16 carbon atoms and an alkoxy group having from 1 to 16 carbon atoms; R3 is an alkyl group having from 1 to 8 carbon atoms or a phenyl group which may be unsubstituted or substituted with an alkyl group having from 1 to 8 carbon atoms;

and n is an integer greater than or equal to 1, preferably 1 or 2;

(50) a method according to (49), wherein each of $Ar^1$ and $Ar^2$ is a phenyl group and R3 is an alkyl group having from 1 to 8 carbon atoms or a phenyl group which may be unsubstituted or substituted with an alkyl group having from 1 to 8 carbon atoms;

(51) a method according to (49), wherein said semiconducting polymer material is TFB [9,9'-dioctylfluorene-co-N-(4-butylphenyl)-diphenylamine]n;

(52) A method according to any one of (40) to (51), wherein said small molecule semiconductor material is selected from the group consisting of substituted pentacenes and organic semiconducting compounds of formula (III):

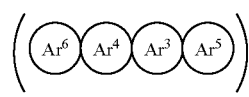

(III)

wherein $Ar^3$, $Ar^4$, $Ar^5$ and $Ar^6$ independently comprise monocyclic aromatic rings and at least one of $Ar^3$, $Ar^4$, $Ar^5$ and $Ar^6$ is substituted with at least one substituent X, which in each occurrence may be the same or different and is selected from the group consisting of (i) unsubstituted or substituted straight, branched or cyclic alkyl groups having from 1 to 20 carbon atoms, alkoxy groups having from 1 to 12 carbon atoms, amino groups that may be unsubstituted or substituted with one or two alkyl groups having from 1 to 8 carbon atoms, each of which may be the same or different, amido groups, silyl groups and alkenyl groups having from 2 to 12 carbon atoms, or (ii) a polymerisable or reactive group selected from the group consisting of halogens, boronic acids, diboronic acids and esters of boronic acids and diboronic acids, alkylene groups having from 2 to 12 carbon atoms and stannyl groups, and wherein $Ar^3$, $Ar^4$, $Ar^5$ and $Ar^6$ may each optionally be fused to one or more further monocyclic aromatic rings, and wherein at least one of $Ar^3$, $Ar^4$, $Ar^5$ and $Ar^6$ comprises a 5- to 7-membered heteroaryl group containing from 1 to 3 sulfur atoms, oxygen atoms, selenium atoms and/or nitrogen atoms;

(53) A method according to (52), wherein Ar5 is fused to a further aryl group $Ar^7$ to provide a structure of formula (IV):

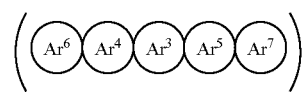

(IV)

wherein $Ar^7$ represents a monocyclic aromatic ring unsubstituted or substituted with one or more substituents X, said monocyclic aromatic ring $Ar^7$ preferably being a 5- to 7-membered heteroaryl group containing from 1 to 3 sulfur atoms, oxygen atoms, selenium atoms and/or nitrogen atoms;

(54) a method according to (53), wherein $Ar^6$ is fused to a further aryl system $Ar^8$ to provide a structure of formula (V):

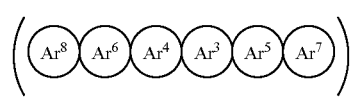

(V)

wherein $Ar^8$ represents a monocyclic aromatic ring unsubstituted or substituted with one or more substituents X, said monocyclic aromatic ring $Ar^8$ preferably being a 5- to 7-membered heteroaryl group containing from 1 to 3 sulfur atoms, oxygen atoms, selenium atoms and/or nitrogen atoms;

(55) a method according to (54), wherein $Ar^7$ is fused to a further aryl system $Ar^9$ to provide a structure of formula (VI):

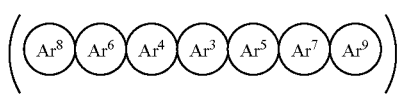

(VI)

wherein Ar⁹ represents a monocyclic aromatic ring unsubstituted or substituted with one or more substituents X, said monocyclic aromatic ring Ar⁹ preferably being a 5- to 7-membered heteroaryl group containing from 1 to 3 sulfur atoms, oxygen atoms, selenium atoms and/or nitrogen atoms;

(56) a method according to (52), wherein said small molecule semiconductor material is a benzothiophene derivative of formula (VII):

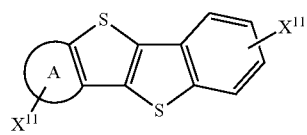

(VII)

wherein A is a phenyl group or a thiophene group, said phenyl group or thiophene group optionally being fused with a phenyl group or a thiophene group which can be unsubstituted or substituted with at least one group of formula $X^{11}$ and/or fused with a group selected from a phenyl group, a thiophene group and a benzothiophene group, any of said phenyl, thiophene and benzothiphene groups being unsubstituted or substituted with at least one group of formula $X^{11}$; and each group $X^{11}$ may be the same or different and is selected from substituents X as defined in (52), and preferably is a group of formula $C_nH_{2n+1}$ wherein n is 0 or an integer of from 1 to 20;

(57) a method according to (56), wherein said small molecule semiconductor material is a benzothiophene derivative of formula (VII) wherein A is selected from:

a thiophene group that is fused with a phenyl group substituted with at least one group of formula $X^{11}$; or a phenyl group that may be unsubstituted or substituted with at least one group of formula $X^{1}1$, said phenyl group further optionally being fused with a thiophene group which can be unsubstituted or substituted with at least one group of formula $X^{1}1$ and/or fused with a benzothiophene group, said benzothiphene group being unsubstituted or substituted with at least one group of formula $X^{11}$, wherein $X^{11}$ is a group of formula $C_nH_{2n+1}$ wherein n is 0 or an integer of from 1 to 16;

(58) a method according to (56), wherein said small molecule semiconductor material is a benzothiophene derivative of formula (VII) selected from the following group:

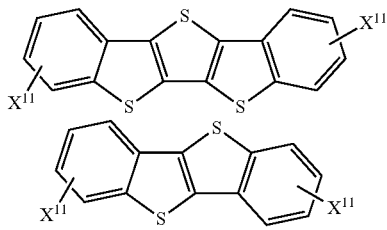

wherein $X^{11}$ is a group of formula $C_nH_{2n+1}$ wherein n is an integer of from 4 to 16;

(59) a method according to any one of (40) to (58) above, wherein the ratio by weight of said small molecule semiconductor material to said polymer material is from 10:90 to 90:10, preferably from 30:70 to 80:20;

(60) a method according to (59), wherein the ratio by weight is from 80:20 to 60:40, preferably 70:30;

(61) a method according to any one of (40) to (41) and 46 to 47 for reducing the contact resistance in an organic thin film transistor, wherein;

said solvent is selected from the group consisting of anisole, 2-methylanisol and 4-methylanisole;

the ratio by weight of said small molecule semiconductor material to said polymer material is from 80:20 to 60:40;

said semiconducting conjugated polymer comprises the repeat unit (I) according to (47) above, wherein $R^1$ and $R^2$ are the same or different and each is selected from the group consisting of an alkyl group having from 4 to 12 carbon atoms and a phenyl group, said phenyl group being unsubstituted or substituted with one or more substituents selected from an alkyl group having from 4 to 8 carbon atoms and an alkoxy group having from 4 to 8 carbon atoms, said semiconducting conjugated polymer further comprising the repeat unit of formula (II) as defined in (49) above wherein each of $Ar^1$ and $Ar^2$ is a phenyl group and $R^3$ is an alkyl group having from 1 to 8 carbon atoms or a phenyl group which may be unsubstituted or substituted with an alkyl group having from 1 to 8 carbon atoms; and said small molecule semiconductor material has the following formula:

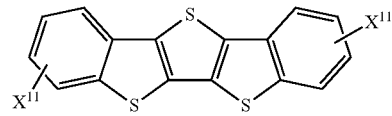

wherein $X^{11}$ is a group of formula $C_nH_{2n+1}$ wherein n is an integer of from 4 to 16;

(62) a method according to (61), wherein:

said solvent is selected from the group consisting of anisole, 2-methylanisole and 4-methylanisole;

the ratio by weight of said small molecule semiconductor material to said polymer material is 70:30;

each group $X^{11}$ in said small molecule semiconductor material is a hexyl group; and said polymer material is TFB [9,9'-dioctylfluorene-co-N-(4-butylphenyl)-diphenylamine]$_n$;

(63) a method according to any one of (40) and (41) to (62) above in reducing the contact resistance in an organic thin film transistor, said organic thin film transistor comprising source and drain electrodes with a channel region therebetween having a channel length, a gate electrode, a dielectric layer disposed between the source and drain electrodes and channel region and the gate electrode and a semiconductor layer, wherein said semiconductor layer is the semiconductor layer according to any one of (40) to (62) above and is disposed in at least the channel region between the source and drain electrodes;

(64) a method according to (63), wherein the channel length is less than or equal to 20 μm, preferably less than or equal to 10 μm; and

(65) a method according to (63) or (64), wherein the proportion of the contact resistance to the total channel resistance in said organic thin film transistor is less than 60%, preferably less than 50%.

DETAILED DESCRIPTION OF THE INVENTION

As explained above, we have discovered that the solvent for the semiconductor layer is critical in order to reduce the contact resistance of organic thin film transistors. By using a solvent selected from the group consisting of $C_{1-4}$ alkoxybenzenes and $C_{1-4}$ alkyl substituted $C_{1-4}$ alkoxybenzenes to deposit a semiconductor layer comprising a blend of a small molecule semiconductor material and a polymer material from a solution thereof in said solvent, the resulting organic thin film transistor comprising the semiconductor blend layer has a much lower contact resistance than that achieved with other solvents.

For example, the contact resistance is reduced substantially compared to an organic thin film transistor employing an equivalent amount of xylene (i.e. the amount of xylene required to prepare a solution with the same concentration of the small molecule semiconductor material and the polymer material) in place of a solvent selected from said group.

Solvents that reduce the contact resistance in accordance with the current invention are selected from the group consisting of $C_{1-4}$ alkoxybenzenes and $C_{1-4}$ alkyl substituted $C_{1-4}$ alkoxybenzenes.

$C_{1-4}$ alkoxybenzenes are benzene groups substituted by an alkoxy group having from 1 to 4 carbon atoms, examples of which include methoxybenzene, ethoxybenzene, propoxybenzene, isopropoxybenzene and butoxybenzene. Preferred examples are anisole and ethoxybenzene, and anisole is particularly preferred.

$C_{1-4}$ alkyl substituted $C_{1-4}$ alkoxybenzenes are the above alkoxybenzenes that are substituted with a single alkyl group having from 1 to 4 carbon atoms, examples of which include methyl, ethyl, propyl, isopropyl and butyl groups. Preferred $C_{1-4}$ alkyl substituted $C_{1-4}$ alkoxybenzenes include anisole substituted in the 2-, 3- or 4-position by a methyl or ethyl group and ethoxybezene substituted in the 2-, 3- or 4-position by a methyl or ethyl group. 2-Methylanisole and 4-methylanisole are particularly preferred.

The polymer material used in the preparation of the blend according to the present invention can be a non-conducting polymer material or it can be a semiconducting polymer material. It can be any polymer material suitable for the purpose of overcoming the low solubility and poor film forming properties of organic semiconducting small molecules, e.g. those known to the skilled person as described in the prior art such as Smith et. al., Applied Physics Letters, Vol 93, 253301 (2008); Russell et. al., Applied Physics Letters, Vol 87, 222109 (2005); Ohe et. al., Applied Physics Letters, Vol 93, 053303 (2008); Madec et. al., Journal of Surface Science & Nanotechnology, Vol 7, 455-458 (2009); and Kang et. al., J. Am. Chem. Soc., Vol 130, 12273-75 (2008).

If it is a semiconducting polymer, it is preferably a conjugated polymer comprising a repeat unit of formula (I) as defined in (8) above. Preferably, said conjugated polymer comprising a repeat unit of formula (I) further comprises a repeat unit of formula (II) as defined in (11) above. Preferred semiconductor materials for use include TFB [9,9'-dioctylfluorene-co-N-(4-butylphenyl)-diphenylamine]$_n$.

The small molecule semiconductor material used in the preparation of the blend according to the present invention can be any small molecule semiconductor material suitable for the purpose, e.g. those known to the skilled person skilled as described in the prior art above or the small molecule semiconductors described in WO2010/061176. Preferred examples of small molecule semiconductor materials for use in the present invention are organic semiconducting compounds of formulae (III) to (VII) as defined in (14) to (24) above. Particularly preferred are those as defined in (24).

In the polymer and small molecule semiconductors as defined in (8) to (13) and (14) to (24) respectively for use in the present invention, alkyl groups in the definitions of $R^1$, $R^2$, $Ar^1$ and $Ar^2$ are alkyl groups having from 1 to 16 carbons atoms and of R3 are alkyl groups having from 1 to 8 carbons atoms, examples of which include methyl, ethyl, propyl, isopropyl and butyl.

In the polymers and small molecule semiconductors as defined in (8) to (13) and (14) to (24) respectively for use in the present invention, alkyl groups in the definitions of $Ar^3$, $Ar^4$, $Ar^5$, $Ar^6$, $Ar^7$, $Ar^8$, $Ar^9$, X, $X^1$, $X^2$, $R^4$ and $R^5$ are alkyl groups having from 1 to 20 carbons atoms, examples of which include methyl, ethyl, propyl, isopropyl and butyl.

In the polymers and small molecule semiconductors as defined in (8) to (13) and (14) to (24) respectively for use in the present invention, aryl groups in the definitions of $R^1$, $R^2$ are aryl groups having from 5 to 14 carbon atoms. Examples include phenyl, indenyl, naphthyl, phenanthrenyl and anthracenyl groups. More preferred aryl groups include phenyl groups.

In the polymers and small molecule semiconductors as defined in (8) to (13) and (14) to (24) respectively for use in the present invention, heteroaryl groups in the definitions of $R^1$, $R^2$, $Ar^1$ and $Ar^2$ are 5- to 7-membered heteroaryl groups containing from 1 to 3 sulfur atoms, oxygen atoms and/or nitrogen atoms and of $Ar^3$, $Ar^4$, $Ar^5$, $Ar^6$, $Ar^7$, $Ar^8$ and $Ar^9$ are 5- to 7-membered heteroaryl groups containing from 1 to 3 sulfur atoms, oxygen atoms, selenium atoms and/or nitrogen atoms. Examples include furyl, thienyl, pyrrolyl, azepinyl, pyrazolyl, imidazolyl, oxazolyl, isoxazolyl, thiazolyl, isothiazolyl, 1,2,3-oxadiazolyl, triazolyl, tetrazolyl, thiadiazolyl, pyranyl, pyridyl, pyridazinyl, pyrimidinyl and pyrazinyl groups. More preferred heteroaryl groups include furyl, thienyl, pyrrolyl and pyridyl, and most preferred is thienyl.

In the polymers and small molecule semiconductors as defined in (8) to (13) and (14) to (24) respectively for use in the present invention, alkoxy groups in the definitions of $R^1$, $R^2$, $Ar^1$ and $Ar^2$ are alkoxy groups having from 1 to 16 carbons atoms, examples of which include methoxy, ethoxy, propoxy, isopropoxy and butoxy.

In the polymers and small molecule semiconductors as defined in (8) to (13) and (14) to (24) respectively for use in the present invention, alkoxy groups in the definitions of X, $X^1$, $X^2$, $R^4$ and $R^5$ are alkoxy groups having from 1 to 12 carbons atoms, examples of which include methoxy, ethoxy, propoxy, isopropoxy and butoxy.

In the polymers and small molecule semiconductors as defined in (8) to (13) and (14) to (24) respectively for use in the present invention, alkenyl groups in the definitions of X, $X^1$, $X^2$, $R^4$ and $R^5$ are alkenyl groups having from 2 to 12 carbon atoms, examples of which include ethenyl, propenyl and 2-methylpropenyl.

In the polymers and small molecule semiconductors as defined in (8) to (13) and (14) to (24) respectively for use in the present invention the unsubstituted or substituted amino groups in the definitions of X, $X^1$, $X^2$, $R^4$ and $R^5$ are amino groups that may be unsubstituted or substituted with one or two alkyl groups that may be the same or different, each having from 1 to 8 carbon atoms, preferably from 1 to 4 carbon atoms. Preferred examples include amino, methylamino, ethylamino and methylethylamino.

In the compounds of formulae (III) to (VI) according to (14) to (21) above, the alkyl groups are straight, branched or cyclic groups having from 1 to 20 carbon atoms and they may be unsubstituted or substituted. Substituents include alkoxy groups having from 1 to 12 carbon atoms, halogen atoms, amino groups that may be unsubstituted or substituted with one or two alkyl groups that may be the same or different and each having from 1 to 8 carbon atoms, acylamino groups having from 2 to 12 carbon atoms, nitro groups, alkoxycarbonyl groups having from 2 to 7 carbon atoms, carboxyl groups, aryl groups having from 5 to 14 carbon atoms and 5- to 7-membered heteroaryl groups containing from 1 to 3 sulfur atoms, oxygen atoms, selenium atoms and/or nitrogen atoms.

In the compounds of formulae (III) to (VI) according to (14) to (17) above, the $Ar^3$, $Ar^4$, $Ar^5$, $Ar^6$, $Ar^7$, $Ar^8$ and $Ar^9$ comprise monocyclic aromatic rings. These are preferably selected from aryl groups having from 5 to 14 carbon atoms and 5- to 7-membered heteroaryl groups containing from 1 to 3 sulfur atoms, oxygen atoms, selenium atoms and/or nitrogen atoms; the monocyclic rings are more preferably selected from phenyl, indenyl, naphthyl, phenanthrenyl, anthracenyl, furyl, thienyl, pyrrolyl and pyridyl, and most preferably phenyl or thienyl.

The organic thin film transistors according to the invention may be any organic thin film transistors that comprise an organic semiconductor layer. The transistors can be p-type or n-type. Suitable transistor configurations include top-gate transistors and bottom-gate transistors. One preferred example of the uses and methods according to the invention is in the preparation of an organic thin film transistor comprising source and drain electrodes with a channel region therebetween, a gate electrode, a dielectric layer disposed between the source and drain electrodes and channel region and the gate electrode and a semiconductor layer, wherein said semiconductor layer is the semiconductor layer according to any one of (1) to (29) above and is disposed in at least the channel region between the source and drain electrodes.

By using a solvent selected from the group consisting of $C_{1-4}$ alkoxybenzenes and $C_{1-4}$ alkyl substituted $C_{1-4}$ alkoxybenzenes to deposit the semiconductor layer in producing an organic thin film transistor such as a top-gate transistor described above, it is possible to reduce the contact resistance considerably. This is of considerable importance, especially in organic thin film transistors with short channel lengths (<20 µm), where this resistance can contribute a significant proportion to the total channel resistance in the device. The higher the contact resistance in the device, the higher the proportion of the applied voltage is dropped across it and, as a result, the lower the bias across the channel region is achieved. The present invention makes it possible to minimise the contact resistance in a simple and cost effective manner, and as a result it is possible to produce devices with a higher mobility.

As noted earlier, one measure of the effectiveness of using a solvent selected from the group consisting of $C_{1-4}$ alkoxybenzenes and $C_{1-4}$ alkyl substituted $C_{1-4}$ alkoxybenzenes in reducing the contact resistance is by comparing the contact resistance obtained with said solvent with that obtained with an organic thin film transistor employing an equivalent amount of xylene in place of a solvent selected from said group. Another measure is the proportion of the contact resistance to the total channel resistance in an organic thin film transistor prepared according to the present invention. Using the above solvents according to the uses or the methods of the present invention, it is possible to obtain a proportion of the contact resistance to the total channel resistance of less than 60%, preferably less than 50%. As a comparison, equivalent devices prepared using xylene as a solvent have a proportion of the contact resistance to the total channel resistance which is 70%. The lower proportion of the contact resistance to the total channel resistance obtained according to the present invention results in a larger proportion of the applied bias across the device being applied across the channel region.

The present invention may be further understood by consideration of the following examples with reference to the following drawings.

EXAMPLES

The following examples focus on the use of certain solvents of the present invention for obtaining high mobility, low contact resistance organic thin film transistor (OTFT) devices. Three specific examples of a small molecule-polymer blend system are given as working examples based on device results obtained in a top-gate, bottom contact device configuration prepared according to the following preparative procedure.

Preparative Example for the Fabrication of Organic Thin Film Transistors (i) Pre-Cleaning of OTFT Substrates and Self Assembled Monolayer (SAM) Pre-Treatments:

The first step in fabrication of the device requires the pre-cleaning of the device substrates and the application of self assembled monolayer materials in order to ensure that a uniform surface energy is obtained in the channel region and the contact resistance is minimised. The substrates consist of gold source and drain electrodes on top of a chrome adhesion layer on the glass surface. The substrates were cleaned by oxygen plasma to ensure any residual photoresist material (used for the source-drain electrode definition) is removed. After the plasma treatment, a channel region SAM (phenethyl-trichlorosilane) was applied from a solution in toluene at a concentration of 20 mM by flooding the substrate in the toluene solution for a period of 2 minutes. The solution was removed by spinning the substrate on a spin coater, then rinsing it in toluene followed by isopropanol. The same process was repeated to apply the electrode SAM material (pentafluorobenzenethiol) at the same concentration in isopropanol for a period of 2 minutes. Again, the substrate was rinsed in isopropanol to remove any unreacted material from the substrate. All of these steps were performed in air. Samples were then transported to a dry nitrogen environment and baked at 60° C. for 10 minutes to ensure the samples were dehydrated.

Figure 1:
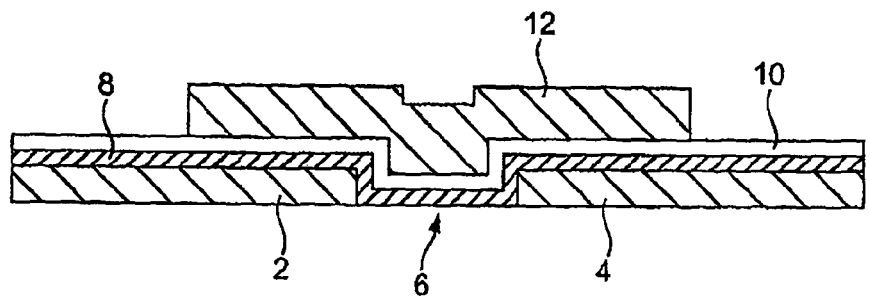
FIG. 1 shows a typical top gate thin film transistor.
Figure 2:
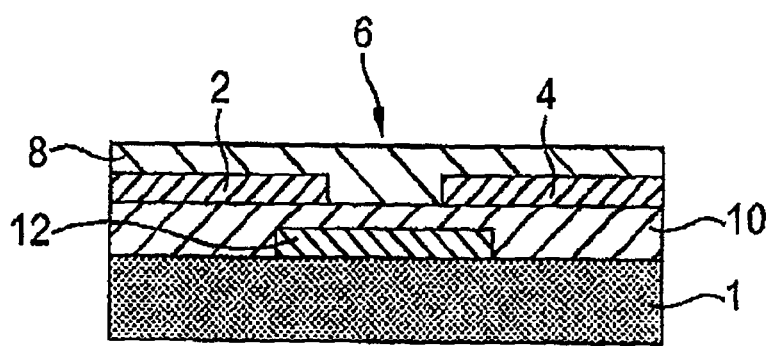
FIG. 2 shows a typical bottom gate thin film transistor.
Figure 3:
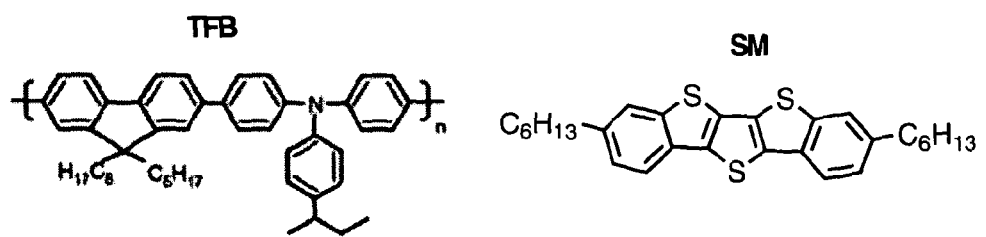
FIG. 3 shows the polymer component TFB and small molecule component SM used in the preparation of the semiconducting blends in the example of the present application.

(ii) Preparation and Spin-Coating of the Semiconductor Blend Material Solution:

The blends of small molecule and polymer materials were prepared by mixing individual solutions by volume in which each component was prepared in anisole. Each component was prepared to a concentration of 0.4% w/v (4 mg per 1 ml of solvent). The polymer component TFB (as disclosed in WO 2010/084977) and small molecule component SM (prepared in accordance with the methods disclosed in WO 2011/004869) are shown in FIG. 3. Once dissolved by heating the solutions, a blend was prepared by mixing the components to a ratio of 7 parts small molecule solution to 3 parts polymer solution. Deposition of this blend was made using a spin coater at a coating speed of 600 rpm for a period of 30 seconds, then dried at 80° C. for a period of 10 minutes, resulting in a film thickness of 30 nm.

Deposition of the Dielectric Layer:

A dielectric layer was then deposited on this semiconductor film. The dielectric material used was the fluorinated polymer polytetrafluoroethylene (PTFE). Other suitable fluorinated polymers that could have been used include perfluoro cyclo oxyaliphatic polymer (CYTOP), perfluoroalkoxy polymer resin (PFA), fluorinated ethylene-propylene (FEP), polyethylenetetrafluoroethylene (ETFE), polyvinylfluoride (PVF), polyethylenechlorotrifluoroethylene (ECTFE), polyvinylidene fluoride (PVDF), polychlorotrifluoroethylene (PCTFE), perfluoro elastomers (FFKM) such as Kalrez™ or Tecnoflon™, fluoro elastomers such as Viton™, Perfluoropolyether (PFPE) and a polymer of tetrafluoroethylene, hexafluoropropylene and vinylidene fluoride (THV).

Fluorinated polymers are an attractive choice for the dielectric material, particularly in the field of organic thin film transistors (OTFTs), because they possess a number of favourable properties including:

(i) Excellent spin coating properties, for instance: (a) wetting on a wide variety of surfaces; and (b) film formation, with the option of doing multi-layer coatings.

(ii) Chemical inertness.

(iii) Quasi-total solvent orthogonality: consequently, the risk of the OSC being dissolved by the solvent used for spin-coating the dielectric is minimal.

(iv) High hydrophobicity: this can be advantageous because it results in low water uptake and low mobility of ionic contaminants in the fluorinated polymer dielectric (low hysteresis).

Figure 4:
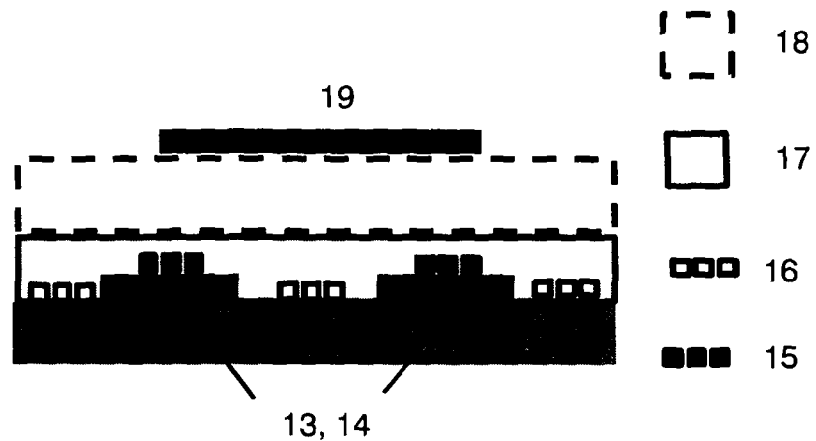
FIG. 4 is a schematic depiction of a top-gate organic thin film transistor prepared according to the present invention.

Deposition of the Gate Electrode:

Finally the gate electrode was deposited by thermal evaporation of 5 nm chrome followed by 200 nm aluminium through a shadow mask to give the desired organic thin film transistor, as shown in schematic form in FIG. 4, wherein 13 and 14 are the source and drain electrodes, 15 is the electrode SAM, 16 is the channel SAM, 17 is the semiconductor blend layer, 18 is the dielectric layer and 19 is the gate electrode.

Device Characterisation:

Devices produced as described above were measured in ambient conditions (no device encapsulation was used) using a Hewlett Packard 4156C semiconductor parameter analyser by measuring output and transfer device characteristics. Device mobility was calculated from the transfer data in the saturation regime. The saturation mobility as shown in the titles of the FIGS. 6 and 7 discussed below refers to the saturation regime mobility, where the drain electrode is biased at −40V with reference to the source electrode. In this regime, the drain current is said to be "saturated" with respect to the drain bias, such that a higher drain bias does not result in a higher drain current. Furthermore, the mobility is a measure of how much current is delivered from the device, and does not necessarily refer to the intrinsic mobility of the semiconductor material itself (although in many instances this is true). For example, a device with the same mobility of material in the channel region may exhibit a higher contact resistance as compared to another device, therefore exhibiting a lower "device" mobility.

Example 1

Figure 5:
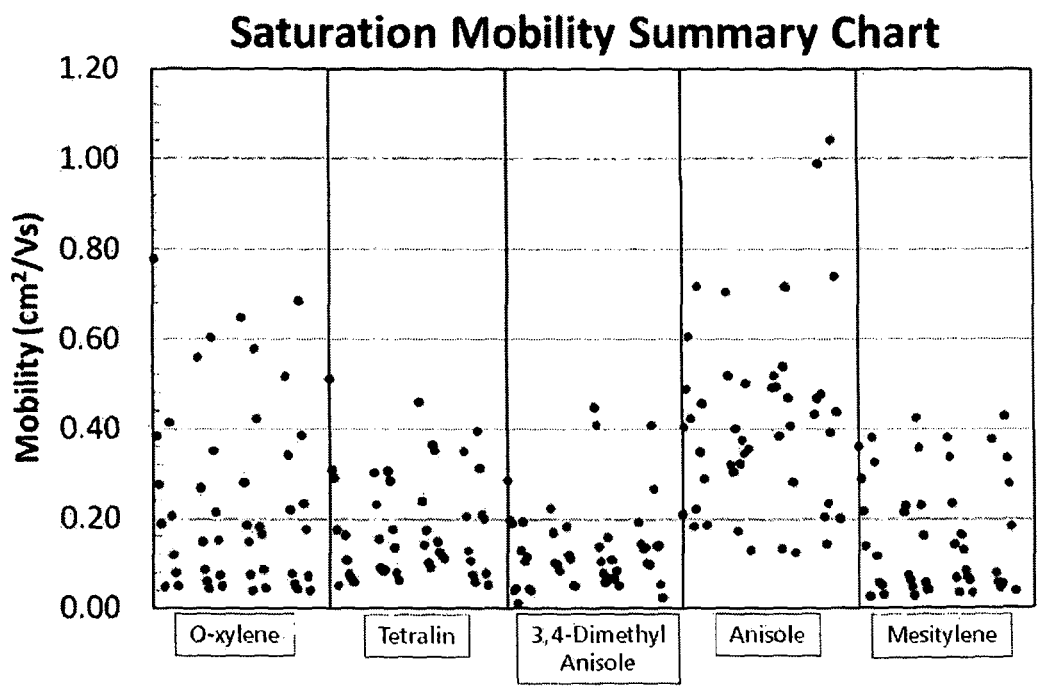
FIG. 5 is a plot of saturation mobility (cm2/Vs) (taken in the saturation regime of the device) obtained for devices using solvents according to the present invention and other solvents that are outside the scope of the invention.

In this first example, data were obtained from devices prepared as described in the above preparative example with semiconductor layers deposited from anisole, and these were compared with data obtained from reference examples of devices with films cast from other solvents, namely o-xylene, tetralin, dimethylanisole and mesitylene. The saturation mobility of the resulting devices was measured and is shown in FIG. 5.

From FIG. 5, the mobility ranges were measured for 5 to 100 µm devices, and these are set out in Table 1 below.

TABLE 1

| | O-xylene | Tetralin | Dimethyl anisole | Anisole | Mesitylene |
|---|---|---|---|---|---|
| Mobility range ($cm^2/Vs$) For 5 to 100 µm devices | 0.039 to 0.778 | 0.051 to 0.510 | $9.4 \times 10^3$ to 0.448 | 0.124 to 1.040 | 0.025 to 0.428 |

The range in mobilities arises from the range of channel lengths used in the test cells (5 to 100 µm). Devices with the shortest channel lengths were found to exhibit lower mobilities (contact resistance is the more dominant component compared to the total channel resistance) and vice versa. The selection of anisole very clearly highlights the improvement in device performance, with all devices exhibiting mobilities of more than 0.1 cm2/Vs.

Figure 6:
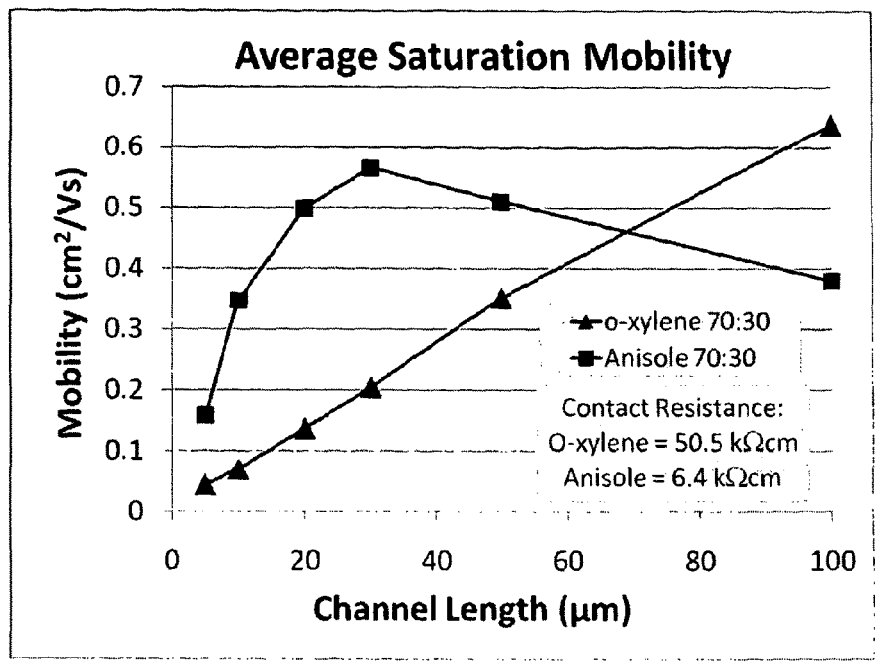
FIG. 6 is a plot of average saturation mobility (cm2/Vs) against channel length (µm) obtained for devices obtained using anisole and o-xylene as solvent.

To highlight the mobility dependence on channel length, FIG. 6 highlights the average saturation mobility for anisole and xylene cast semiconductor films. Data are based on 8 thin film transistors per channel length. The contact resistance for these devices was calculated by extrapolating the total channel resistance from the output characteristics at low drain bias (in the linear regime from 0 V to −6 V) for a series of devices with channel lengths from 5 to 100 µm. It was found that there was a substantial reduction in contact resistance in the anisole cast devices, the mobility of short channel length devices from this solution improving by a factor of 3.6 and 4.9 for 5 and 10 um channel length devices respectively in comparison to the o-xylene cast films.

Example 2

A reduced contact resistance is only part of the reason for realising an improved device performance when using the solvents of the invention such as anisole as the organic semiconductor solvent in place of xylene or another conventional solvent. In addition to a lower absolute contact resistance, the proportion of contact resistance to the total channel resistance was also found to be lower for devices using the solvents of the invention such as anisole. Table 2 below highlights the average values of contact and channel resistances for a series of devices with organic semiconductor layers deposited from xylene or anisole. The devices were produced by depositing an SM:TFB organic blend with a mass ratio of 70:30 respectively from a solution thereof in the tested solvents. Values were calculated for a gate bias of −40 V, and normalised to the channel width (all devices have a channel width of 2 mm).

The total channel resistance shown in Table 2 below is defined as the sum of the contact and channel resistances in the device. The contact resistance is associated with the metal-semiconductor interface and the channel resistance is associated with the intrinsic mobility of the semiconductor material itself in the channel region (a low resistance implying a high mobility material).

TABLE 2

| Parameter | O-xylene | Anisole |
| --- | --- | --- |
| Contact resistance (kΩcm) | 50.51 | 6.43 |
| Total channel resistance for L = 10 μm device (kΩcm) | 76.90 | 15.93 |
| Total channel resistance for L = 100 μm device (kΩcm) | 363.66 | 90.36 |
| Contact resistance as a proportion to total channel resistance For L = 10 μm device (%) | 69.58 | 43.90 |
| Contact resistance proportion to total channel resistance For L = 100 μm device (%) | 22.33 | 9.99 |

Devices with organic semiconductor films cast from anisole exhibited a contact resistance of just 12% of the value observed for devices with films cast from xylene. Furthermore, films cast from anisole also show an improved (lower) channel resistance as compared to that from devices with films cast from xylene. The average channel resistance (total channel resistance minus the contact resistance) for films cast from xylene is 26.4 kΩcm, and for anisole devices is 9.5 kΩcm, implying that the mobility of the material in the channel region is also improved when using anisole as the semiconductor film solvent.

Another view of highlighting the improved device performance from the anisole based semiconductor inks can be represented by the proportion of the contact to the total channel resistance in the device. Devices prepared from anisole show a lower proportion of this contact resistance to the overall resistance in the device channel of 44%, to that in xylene ink based devices (70%).

Example 3

Figure 7:
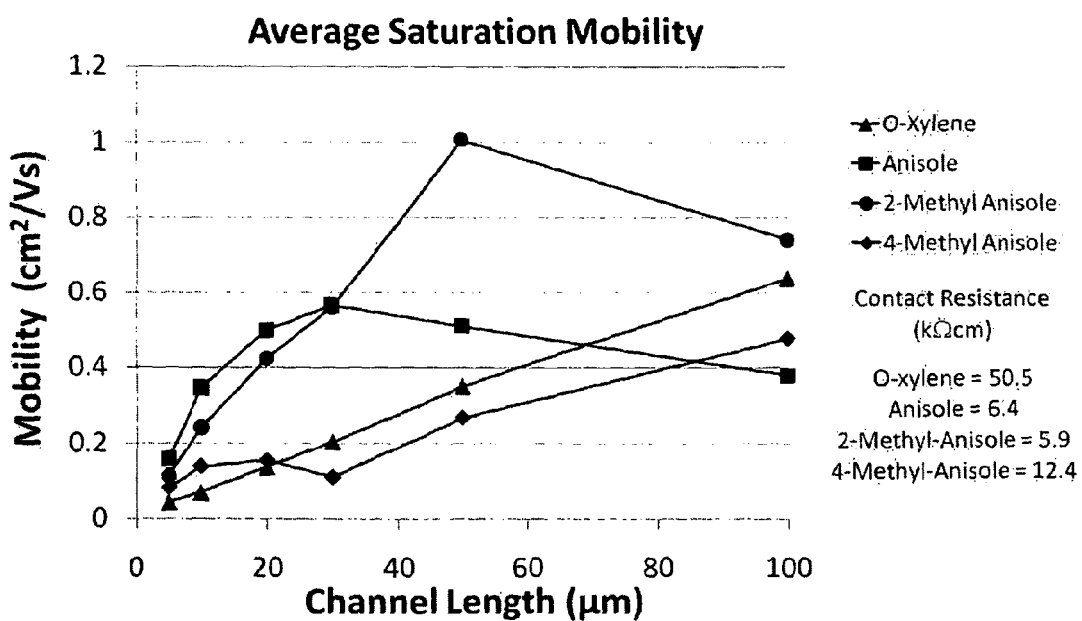
FIG. 7 is a plot of average saturation mobility (cm2/Vs) against channel length (µm) obtained for devices obtained using anisole, 2-methylanisole, 4-methylanisole and o-xylene as solvent.

In this example, further solvents were tested and also found to have superior properties in reducing contact resistance. Devices were prepared as in the preparative example using a solution of a 30:70 mix of polymer component TFB and small molecule component SM in the solvents 2-methylanisole and 4-methylanisole as the organic semiconducting layer. Comparative devices were also prepared using anisole (another according to the invention) and o-xylene as solvents, as in Example 1. The average saturation mobility of the devices was measured and is shown in FIG. 7 together with the average contact resistance for each of the devices.

The results clearly show that the devices prepared using 2-methylanisole and 4-methylanisole as the solvent in depositing the organic semiconductor blend have significantly lower contact resistance values and higher average saturation regime mobilities than that obtained from inks produced in o-xylene. Due to the lower contact resistance for these anisole derivatives, an increase in the mobility for short channel length devices (L<20 μm) can be realised.

The mobility data in Table 3 below highlights the average mobility of devices with channel lengths of 5 & 10 μm. It is evident from these figures that the average mobility in short channel length devices in which the organic semiconductor layer is deposited from one of the solvents of the invention is significantly greater than that achieved with alternative solvents such as xylene.

TABLE 3

| | O-xylene | Anisole | 2-Methyl-Anisole | 4-Methyl-Anisole |
| --- | --- | --- | --- | --- |
| Mobility ($cm^2/Vs$) For 5 & 10 μm devices | 0.04 & 0.07 | 0.16 & 0.35 | 0.11 & 0.24 | 0.08 & 0.14 |

In summary the improved mobility performance of devices with semiconductor films cast from the solvents of the invention can be attributed to:
1. Lower absolute contact resistance
2. Lower absolute channel resistance
3. Lower proportion of contact resistance to the total channel resistance.

The above give rise to both a higher intrinsic mobility of the semiconductor film (2) and a larger bias being applied across the channel region of the device (1) and (3). Such a combination results in a higher device mobility for short channel length devices.

The invention claimed is:

1. A method for reducing the contact resistance in an organic thin film transistor comprising a channel region and a semiconductor layer, wherein said semiconductor layer comprises a blend of a small molecule semiconductor material and a polymer material, said method comprising depositing said small molecule semiconductor material and said polymer material from a solution thereof in said channel region of said organic thin film transistor, wherein said solution comprises a solvent selected from the group consisting of 2-methylanisole and 4-methylanisole.

2. A method for reducing the contact resistance in an organic thin film transistor comprising a channel region and a semiconductor layer, wherein said semiconductor layer comprises a blend of a small molecule semiconductor material and a polymer material, said method comprising the steps of:
   (i) selecting a solvent from the group consisting of 2-methylanisole and 4-methylanisole;
   (ii) forming a solution of said small molecule semiconductor material and said polymer material in said solvent selected in step (i); and
   (iii) depositing a semiconductor layer comprising a blend of said small molecule semiconductor material and said polymer material from the solution prepared in step (ii) in the channel region of said organic thin film transistor.

3. A method according to claim 2, wherein step (ii) comprises forming a first solution of said small molecule semiconductor material in said solvent, forming a further solution of said polymer material in the same said solvent and then mixing the first and further solutions.

4. A method according to claim 1, wherein the contact resistance is reduced compared to an organic thin film transistor employing an equivalent amount of xylene in place of a solvent selected from said group.

5. A method according to claim 4, wherein the contact resistance using said solvent in depositing said semiconductor layer of said organic thin film transistor is less than 30% the value obtained employing an equivalent amount of xylene.

6. A method according to claim 1, wherein the polymer material is a semiconducting polymer material.

7. A method according to claim 6, wherein said semiconducting polymer material is a conjugated polymer comprising a repeat unit of formula (I)

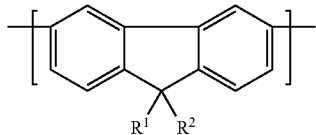
(I)

wherein $R^1$ and $R^2$ are the same or different and each is selected from the group consisting of hydrogen, an alkyl group having from 1 to 16 carbon atoms, an aryl group having from 5 to 14 carbon atoms and a 5- to 7-membered heteroaryl group containing from 1 to 3 sulfur atoms, oxygen atoms and/or nitrogen atoms, said aryl group or heteroaryl group being unsubstituted or substituted with one or more substituents selected from an alkyl group having from 1 to 16 carbon atoms and an alkoxy group having from 1 to 16 carbon atoms.

8. A method according to claim 7, wherein said semiconducting polymer material is a conjugated polymer comprising the repeat unit (I), wherein $R^1$ and $R^2$ are the same or different and each is selected from the group consisting of an alkyl group having from 4 to 12 carbon atoms and a phenyl group, said phenyl group being unsubstituted or substituted with one or more substituents selected from an alkyl group having from 4 to 8 carbon atoms and an alkoxy group having from 4 to 8 carbon atoms.

9. A method according to claim 7, wherein said semiconducting polymer material is a conjugated polymer comprising the repeat unit (I), said polymer further comprising a repeat unit of formula (II):

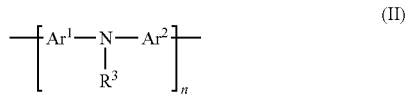
(II)

wherein $Ar^1$ and $Ar^2$ are the same or different and each is selected from the group consisting of an aryl group having from 5 to 14 carbon atoms and a 5- to 7-membered heteroaryl group containing from 1 to 3 sulfur atoms, oxygen atoms and/or nitrogen atoms, said aryl group or heteroaryl group being unsubstituted or substituted with one or more substituents selected from an alkyl group having from 1 to 16 carbon atoms and an alkoxy group having from 1 to 16 carbon atoms; $R^3$ is an alkyl group having from 1 to 8 carbon atoms or a phenyl group which may be unsubstituted or substituted with an alkyl group having from 1 to 8 carbon atoms; and n is an integer greater than or equal to 1.

10. A method according to claim 9, wherein each of $Ar^1$ and $Ar^2$ is a phenyl group and $R^3$ is an alkyl group having from 1 to 8 carbon atoms or a phenyl group which may be unsubstituted or substituted with an alkyl group having from 1 to 8 carbon atoms.

11. A method according to claim 9, wherein said semiconducting polymer material is TFB [9,9'-dioctylfluorene-co-N-(4-butylphenyl)-diphenylamine]$_n$.

12. A method according to claim 1, wherein said small molecule semiconductor material is selected from the group consisting of substituted pentacenes and organic semiconducting compounds of formula (III):

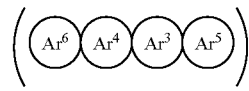
(III)

wherein $Ar^3$, $Ar^4$, $Ar^5$ and $Ar^6$ independently comprise monocyclic aromatic rings and at least one of $Ar^3$, $Ar^4$, $Ar^5$ and $Ar^6$ is substituted with at least one substituent X, which in each occurrence may be the same or different and is selected from the group consisting of (i) unsubstituted or substituted straight, branched or cyclic alkyl groups having from 1 to 20 carbon atoms, alkoxy groups having from 1 to 12 carbon atoms, amino groups that may be unsubstituted or substituted with one or two alkyl groups having from 1 to 8 carbon atoms, each of which may be the same or different, amido groups, silyl groups and alkenyl groups having from 2 to 12 carbon atoms, or (ii) a polymerizable or reactive group selected from the group consisting of halogens, boronic acids, diboronic acids and esters of boronic acids and diboronic acids, alkylene groups having from 2 to 12 carbon atoms and stannyl groups, and wherein $Ar^3$, $Ar^4$, $Ar^5$ and $Ar^6$ may each optionally be fused to one or more further monocyclic aromatic rings, and wherein at least one of $Ar^3$, $Ar^4$, $Ar^5$ and $Ar^6$ comprises a 5- to 7-membered heteroaryl group containing from 1 to 3 sulfur atoms, oxygen atoms, selenium atoms and/or nitrogen atoms.

13. A method according to claim 12, wherein $Ar^5$ is fused to a further aryl group $Ar^7$ to provide a structure of formula (IV):

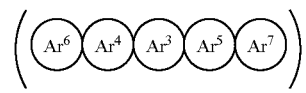
(IV)

wherein $Ar^7$ represents a monocyclic aromatic ring unsubstituted or substituted with one or more substituents X.

14. A method according to claim 13, wherein $Ar^6$ is fused to a further aryl system $Ar^8$ to provide a structure of formula (V):

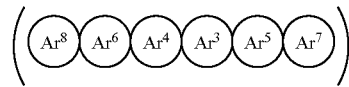
(V)

wherein $Ar^8$ represents a monocyclic aromatic ring unsubstituted or substituted with one or more substituents X.

15. A method according to claim 14, wherein $Ar^7$ is fused to a further aryl system $Ar^9$ to provide a structure of formula (VI):

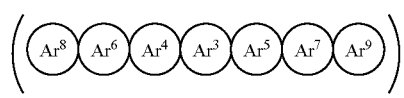
(VI)

wherein $Ar^9$ represents a monocyclic aromatic ring unsubstituted or substituted with one or more substituents X.

16. A method according to claim 12, wherein said small molecule semiconductor material is a benzothiophene derivative of formula (VII):

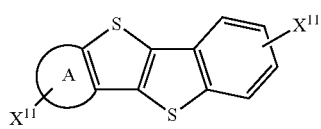
(VII)

wherein A is a phenyl group or a thiophene group, said phenyl group or thiophene group optionally being fused with a phenyl group or a thiophene group which can be unsubstituted or substituted with at least one group of formula $X^{11}$ and/or fused with a group selected from a phenyl group, a thiophene group and a benzothiophene group, any of said phenyl, thiophene and benzothiophene groups being unsubstituted or substituted with at least one group of formula $X^{11}$; and each group $X^{11}$ may be the same or different and is a substituent X.

17. A method according to claim 16, wherein said small molecule semiconductor material is a benzothiophene derivative of formula (VII) wherein A is selected from:

a thiophene group that is fused with a phenyl group substituted with at least one group of formula $X^{11}$; or a phenyl group that may be unsubstituted or substituted with at least one group of formula $X^{11}$, said phenyl group further optionally being fused with a thiophene group which can be unsubstituted or substituted with at least one group of formula $X^{11}$ and/or fused with a benzothiophene group, said benzothiphene group being unsubstituted or substituted with at least one group of formula $X^{11}$, wherein $X^{11}$ is a group of formula $C_nH_{2n+1}$ wherein n is 0 or an integer of from 1 to 16.

18. A method according to claim 16, wherein said small molecule semiconductor material is a benzothiophene derivative of formula (VII) selected from the following group:

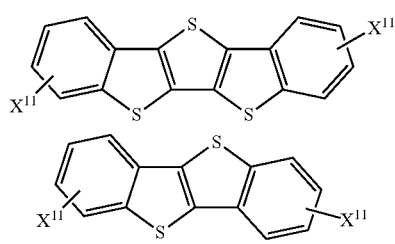

wherein $X^{11}$ is a group of formula $C_nH_{2n+1}$ wherein n is an integer of from 4 to 16.

19. A method according to claim 1, wherein the ratio by weight of said small molecule semiconductor material to said polymer material is from 10:90 to 90:10.

20. A method according to claim 19, wherein the ratio by weight is from 80:20 to 60:40.

21. A method according to claim 1, wherein;

wherein the ratio by weight of said small molecule semiconductor material to said polymer material is from 80:20 to 60:40;

said semiconducting conjugated polymer comprises a repeat unit of formula (I):

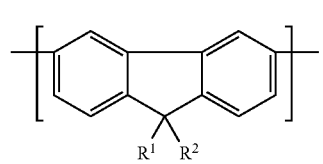
(I)

wherein $R^1$ and $R^2$ are the same or different and each is selected from the group consisting of an alkyl group having from 4 to 12 carbon atoms and a phenyl group, said phenyl group being unsubstituted or substituted with one or more substituents selected from an alkyl group having from 4 to 8 carbon atoms and an alkoxy group having from 4 to 8 carbon atoms, said semiconducting conjugated polymer further comprising a repeat unit of formula (II):

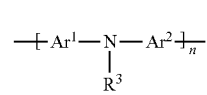
(II)

wherein $Ar^1$ and $Ar^2$ are the same or different and each is selected from the group consisting of an aryl group having from 5 to 14 carbon atoms and a 5- to 7-membered heteroaryl group containing from 1 to 3 sulfur atoms, oxygen atoms and/or nitrogen atoms, said aryl group or heteroaryl group being unsubstituted or substituted with one or more substituents selected from an alkyl group having from 1 to 16 carbon atoms and an alkoxy group having from 1 to 16 carbon atoms; $R^3$ is an alkyl group having from 1 to 8 carbon atoms or a phenyl group which may be unsubstituted or substituted with an alkyl group having from 1 to 8 carbon atoms;

and n is an integer greater than or equal to 1 wherein each of $Ar^1$ and $Ar^2$ is a phenyl group and $R^3$ is an alkyl group having from 1 to 8 carbon atoms or a phenyl group which may be unsubstituted or substituted with an alkyl group having from 1 to 8 carbon atoms; and said small molecule semiconductor material has the following formula:

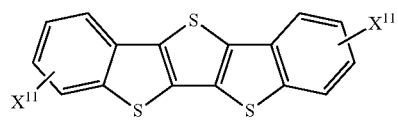

wherein $X^{11}$ is a group of formula $C_nH_{2n+1}$ wherein n is an integer of from 4 to 16.

22. A method according to claim 21, wherein:

the ratio by weight of said small molecule semiconductor material to said polymer material is 70:30;

each group $X^{11}$ in said small molecule semiconductor material is a hexyl group; and said polymer material is TFB [9,9'-dioctylfluorene-co-N-(4-butylphenyl)-diphenylamine]$_n$.

23. A method according to claim 1, said organic thin film transistor comprising source and drain electrodes with a channel region therebetween having a channel length, a gate electrode, a dielectric layer disposed between the source and drain electrodes and channel region and the gate electrode, and a semiconductor layer, wherein said semiconductor layer is disposed in at least the channel region between the source and drain electrodes.

24. A method according to claim 23, wherein the channel length is less than or equal to 20 μm.

25. A method according to claim 23, wherein the proportion of the contact resistance to the total channel resistance in said organic thin film transistor is less than 60%.

26. A method according to claim 13, wherein said monocyclic aromatic ring $Ar^7$ comprises a 5- to 7-membered heteroaryl group containing from 1 to 3 sulfur atoms, oxygen atoms, selenium atoms and/or nitrogen atoms.

27. A method according to claim 14, wherein said monocyclic aromatic ring $Ar^8$ comprises a 5- to 7-membered heteroaryl group containing from 1 to 3 sulfur atoms, oxygen atoms, selenium atoms and/or nitrogen atoms.

28. A method according to claim 15, wherein said monocyclic aromatic ring $Ar^9$ comprises a 5- to 7-membered heteroaryl group containing from 1 to 3 sulfur atoms, oxygen atoms, selenium atoms and/or nitrogen atoms.

29. A method according to claim 15, wherein each of said monocyclic aromatic rings $Ar^7$, $Ar^9$, and $Ar^9$ comprises a 5- to 7-membered heteroaryl group containing from 1 to 3 sulfur atoms, oxygen atoms, selenium atoms and/or nitrogen atoms.

* * * * *